(12) United States Patent
Voegerl et al.

(10) Patent No.: US 8,853,547 B2
(45) Date of Patent: Oct. 7, 2014

(54) FLEXIBLE PRINTED BOARD

(75) Inventors: Andreas Voegerl, Parsberg (DE); Tilo Liebl, Hersbruck (DE); Gerhard Bauer, Graefenberg (DE); Marion Gebhardt, Graefenberg (DE); Alexander Wenk, Burgoberbach (DE); Matthias Wieczorek, Neunkirchen am Sand (DE); Juergen Henniger, Erlangen-Dechsendorf (DE); Karl-Heinz Baumann, Viernheim (DE)

(73) Assignees: Conti Temic microelectronic GmbH, Nuernberg (DE); Carl Freudenberg KG, Weinheim (DE)

( * ) Notice: Subject to any disclaimer, the term of this patent is extended or adjusted under 35 U.S.C. 154(b) by 615 days.

(21) Appl. No.: 13/124,699

(22) PCT Filed: Oct. 9, 2009

(86) PCT No.: PCT/DE2009/001409
§ 371 (c)(1),
(2), (4) Date: May 27, 2011

(87) PCT Pub. No.: WO2010/043203
PCT Pub. Date: Apr. 22, 2010

(65) Prior Publication Data
US 2011/0232946 A1   Sep. 29, 2011

(30) Foreign Application Priority Data
Oct. 18, 2008 (DE) .......................... 10 2008 052 244

(51) Int. Cl.
*H05K 1/00* (2006.01)
*H05K 1/11* (2006.01)
*H05K 3/00* (2006.01)
*H05K 3/28* (2006.01)

(52) U.S. Cl.
CPC ........ *H05K 1/118* (2013.01); *H05K 2201/2009* (2013.01); *H05K 2203/049* (2013.01);
(Continued)

(58) Field of Classification Search
CPC ............. H05K 1/00; H05K 1/02; H05K 1/03; H05K 1/09; H05K 1/10; H05K 1/46; H05K 1/361; H05K 1/464; H05K 1/4691; H05K 3/10; H05K 21/02; H05K 21/48; H05K 21/468; H01L 23/16; H01L 23/48; H01L 23/495; H01L 23/49
USPC ......... 174/254, 250, 252, 255, 256, 261, 262, 174/264; 361/751, 784, 792; 257/632, 668, 257/669, 710, 728, 737, 778; 428/192, 209, 428/414; 438/109, 122, 123, 131
See application file for complete search history.

(56) References Cited

U.S. PATENT DOCUMENTS 4,604,799 A * 8/1986 Gurol .............................. 29/847
4,687,695 A * 8/1987 Hamby ......................... 428/192
(Continued)

FOREIGN PATENT DOCUMENTS

DE   38 13 565   11/1989
DE   39 25 155   2/1991
(Continued)

OTHER PUBLICATIONS

German Search Report for German Application No. 10 2008 052 244.9, dated Jan. 22, 2009, 4 pages, with English translation, 4 pages, Muenchen, Germany.

(Continued)

*Primary Examiner* — Xiaoliang Chen
(74) *Attorney, Agent, or Firm* — W. F. Fasse

(57) ABSTRACT

A flexible printed circuit board, in particular for the spatial connection of electronic components, includes a carrier foil (1), several bonding surfaces (10) arranged on a solder side (4) of the carrier foil (1), and several soldering surfaces (2) arranged on a bonding side (12) of the carrier foil (1) opposite the solder side. The soldering surfaces (2) are connected to the bonding surfaces (10) via electrical strip conductors, and a stiffening plate (3) is inseparably connected to the carrier foil (1) on the solder side thereof.

18 Claims, 3 Drawing Sheets

(52) U.S. Cl.
CPC ...... *H05K 3/0058* (2013.01); *H05K 2201/0394* (2013.01); *H05K 3/281* (2013.01)
USPC .......... 174/254; 174/250; 174/252; 174/255; 174/256; 174/261; 174/262; 174/264; 361/751; 361/784; 361/792; 257/632; 257/668; 257/669; 257/710; 257/728; 257/737; 257/778; 428/192; 428/209; 428/414; 438/109; 438/122; 438/123; 438/131

(56) References Cited

U.S. PATENT DOCUMENTS

| | | | |
|---|---|---|---|
| 4,715,928 A * | 12/1987 | Hamby | 216/18 |
| 4,961,806 A * | 10/1990 | Gerrie et al. | 156/252 |
| 5,048,747 A * | 9/1991 | Clark et al. | 228/180.21 |
| 5,084,124 A | 1/1992 | Taniguchi | |
| 5,097,390 A * | 3/1992 | Gerrie et al. | 361/784 |
| 5,142,448 A * | 8/1992 | Kober et al. | 361/751 |
| 5,144,534 A * | 9/1992 | Kober | 361/751 |
| 5,168,430 A | 12/1992 | Nitsch et al. | |
| 5,345,040 A | 9/1994 | Stade et al. | |
| 5,478,244 A | 12/1995 | Maue et al. | |
| 5,759,417 A | 6/1998 | Inaba | |
| 5,760,465 A * | 6/1998 | Alcoe et al. | 257/669 |
| 5,877,043 A * | 3/1999 | Alcoe et al. | 438/123 |
| 5,877,543 A * | 3/1999 | Matsubara et al. | 257/674 |
| 5,879,786 A * | 3/1999 | Budnaitis et al. | 428/209 |
| 5,923,535 A * | 7/1999 | Shimada et al. | 361/749 |
| 5,976,910 A * | 11/1999 | Tamura et al. | 438/107 |
| 6,011,697 A * | 1/2000 | Budnaitis et al. | 361/792 |
| 6,087,597 A * | 7/2000 | Shimada et al. | 174/263 |
| 6,099,745 A * | 8/2000 | McKenney et al. | 216/13 |
| 6,184,589 B1 * | 2/2001 | Budnaitis et al. | 257/690 |
| 6,333,468 B1 * | 12/2001 | Endoh et al. | 174/256 |
| 6,335,563 B1 * | 1/2002 | Hashimoto | 257/632 |
| 6,461,527 B1 * | 10/2002 | Haupt et al. | 216/18 |
| 6,462,274 B1 * | 10/2002 | Shim et al. | 174/535 |
| 6,570,250 B1 * | 5/2003 | Pommer | 257/731 |
| 6,670,700 B1 * | 12/2003 | Hashimoto | 257/686 |
| 6,734,535 B1 * | 5/2004 | Hashimoto | 257/668 |
| 6,741,778 B1 * | 5/2004 | Chan et al. | 385/52 |
| 6,953,999 B2 * | 10/2005 | Strandberg et al. | 257/778 |
| 7,142,433 B2 | 11/2006 | Lechner | |
| 7,392,584 B2 * | 7/2008 | Chambers | 29/852 |
| 7,505,278 B2 | 3/2009 | Choi et al. | |
| 7,649,254 B2 * | 1/2010 | Graydon et al. | 257/710 |
| 7,722,364 B2 | 5/2010 | Klinger et al. | |
| 2001/0013654 A1 * | 8/2001 | Kalidas et al. | 257/738 |
| 2001/0053563 A1 * | 12/2001 | Kim et al. | 438/106 |
| 2002/0061609 A1 * | 5/2002 | Hashimoto | 438/131 |
| 2002/0063331 A1 * | 5/2002 | Honda | 257/737 |
| 2002/0159001 A1 | 10/2002 | Kim | |
| 2002/0189854 A1 * | 12/2002 | Crumly | 174/254 |
| 2003/0173663 A1 * | 9/2003 | Kami et al. | 257/728 |
| 2003/0176020 A1 * | 9/2003 | Tsao et al. | 438/122 |
| 2004/0099958 A1 * | 5/2004 | Schildgen et al. | 257/778 |
| 2004/0118603 A1 * | 6/2004 | Chambers | 174/261 |
| 2004/0169786 A1 * | 9/2004 | Yamazaki et al. | 349/61 |
| 2004/0246626 A1 * | 12/2004 | Wakaki et al. | 360/245.8 |
| 2004/0262753 A1 * | 12/2004 | Kashiwazaki | 257/734 |
| 2005/0047776 A1 * | 3/2005 | Watanabe et al. | 396/543 |
| 2005/0048698 A1 * | 3/2005 | Yamaguchi | 438/109 |
| 2005/0073247 A1 * | 4/2005 | Yamazaki et al. | 313/503 |
| 2005/0202694 A1 * | 9/2005 | Yumoto et al. | 439/67 |
| 2005/0275093 A1 * | 12/2005 | Noma | 257/734 |
| 2006/0131065 A1 * | 6/2006 | Ohwaki | 174/252 |
| 2006/0166524 A1 | 7/2006 | Ho et al. | |
| 2006/0285279 A1 * | 12/2006 | Kent et al. | 361/600 |
| 2007/0012475 A1 * | 1/2007 | Kawaguchi et al. | 174/255 |
| 2007/0036953 A1 * | 2/2007 | Nonaka et al. | 428/209 |
| 2007/0036954 A1 * | 2/2007 | Ikishima et al. | 428/209 |
| 2007/0045746 A1 * | 3/2007 | Sunohara et al. | 257/360 |
| 2007/0116964 A1 * | 5/2007 | Guo et al. | 428/414 |
| 2007/0218781 A1 * | 9/2007 | Yokai et al. | 439/752 |
| 2007/0235218 A1 * | 10/2007 | Miyamoto et al. | 174/261 |
| 2007/0241457 A1 * | 10/2007 | Ida | 257/738 |
| 2008/0107802 A1 * | 5/2008 | Kawaguchi et al. | 427/97.2 |
| 2008/0283276 A1 * | 11/2008 | Takahashi et al. | 174/250 |
| 2008/0283287 A1 * | 11/2008 | Takahashi et al. | 174/264 |
| 2009/0020317 A1 * | 1/2009 | Takahashi et al. | 174/254 |
| 2009/0020326 A1 * | 1/2009 | Takahashi et al. | 174/262 |
| 2009/0084583 A1 * | 4/2009 | Ueno | 174/254 |
| 2009/0107703 A1 * | 4/2009 | Abe et al. | 174/254 |
| 2010/0102838 A1 * | 4/2010 | Kitazume et al. | 324/754 |
| 2010/0103296 A1 * | 4/2010 | Nakagiri et al. | 348/294 |
| 2012/0067622 A1 | 3/2012 | Scharrer et al. | |

FOREIGN PATENT DOCUMENTS

| | | |
|---|---|---|
| DE | 199 29 179 | 1/2001 |
| DE | 102005063272 | 7/2007 |
| JP | 61-154094 A | 7/1986 |
| JP | 5-021515 | 1/1993 |
| JP | 2000-059051 A | 2/2000 |
| JP | 2006-269508 | 10/2006 |
| JP | 2008/021832 A | 1/2008 |
| JP | 2008/130617 A | 6/2008 |

OTHER PUBLICATIONS

International Search Report of the International Searching Authority for International Application PCT/DE2009/001409, mailed Dec. 30, 2009, 2 pages, European Patent Office, HV Rijswijk, Netherlands.

English Translation of PCT Written Opinion of the International Searching Authority for International Application PCT/DE2009/001409, mailed Dec. 30, 2009, 4 pages, European Patent Office, HV Rijswijk, Netherlands.

* cited by examiner

FLEXIBLE PRINTED BOARD

FIELD OF THE INVENTION

The invention relates to a flexible printed board, in particular for the spatial connection of electronic components.

BACKGROUND INFORMATION

Printed boards are known as carriers made of insulating material with firmly adhering conductive connections, wherein a printed board serves to mechanically attach and electrically connect electronic components. It is also known that the freedom of the designing of printed boards can be increased by using a flexible carrier material. So-called flexible printed boards can be arranged in a space-saving manner by folding them in an available limited installation space.

For establishing connections to electronic components, bonding surfaces and soldering surfaces are arranged on a flexible printed board. The bonding surfaces and the soldering surfaces are attached to a top of a flexible printed board in an expensive manufacturing process. The increasing miniaturization of electronic devices and a reduced available installation space for flexible printed boards that results from said miniaturization as well as new mounting and joining methods require flexible printed boards that are designed in such a manner that the top and a bottom arranged opposite the top are contactable.

It is also known that a flexible printed board can be contacted on both sides by bending a flexible printed board contacted on one side by 180° and by subsequent conglutination. Such flexible printed boards are expensive on account of the bending operation and the cold-bonding operation that have to be carried out manually. Furthermore, the durability of the cold-bonded joint in the bent region of the flexible printed board is not guaranteed, particularly under the influence of temperature. A highly reliable flexible printed board contacted on both sides will be achieved by a double-layer design of two flexible printed boards each of them being contactable on one side thereof, wherein a non-contactable surface of the first board and a non-contactable surface of the second board are conglutinated. Such a flexible printed board is expensive since two flexible printed boards each of them being contactable on one side thereof are used for the manufacturing of said flexible printed board.

SUMMARY OF THE INVENTION

The object of the present invention is to provide a flexible printed board reliably and cost-effectively in such a manner that electronic components can be contacted on both sides of the flexible printed board.

This object is achieved according to the invention by a flexible printed board with the following features.

According to the invention it was realized that a flexible printed board can be contacted on both sides when soldering surfaces are arranged on a solder side of a carrier foil of the flexible printed board and bonding surfaces are arranged on a bonding side of the carrier foil, which bonding side is arranged opposite the solder side. Such a design of the flexible printed board enables the flexible printed board to be manufactured cost-effectively and reliably since expensive material and manufacturing as well as a stability-critical bending process can be avoided.

A carrier foil that is covered by respective covering layers on the opposite sides thereof ensures a protection of an electrically conductive layer of the carrier foil by the covering layers attached to both sides thereof.

Each covering layer may comprise a protective layer and an adhesive layer that attaches the protective layer to the electrically conductive layer of the carrier foil. This achieves, on the one hand, a good connection of the covering layer to an electrically conductive layer and guarantees, on the other hand, a sufficient protection of the electrically conductive layer.

A protective layer may be made of a synthetic material, particularly polyimide, which can be manufactured in a cost-effective manner.

An electrically conductive layer may be a copper foil, which is characterized by a high electrical conductivity.

A flexible printed board may be rectangular, with the soldering surfaces and bonding surfaces at opposite edges thereof. This allows an improved freedom of the designing of the arrangement of the flexible printed board.

A flexible printed board may have a carrier foil that is not plane. This allows the connection of electrical contacts that are not arranged level or coplanar with each other.

In another aspect, the covering layers may be removed from sections of the carrier foil, and a contacting layer may be provided there. This serves to connect a contacting layer to an electrically conductive layer.

A contacting layer may consist of a nickel-gold compound, which is insensitive to thermal stress and resistant to moisture.

A flexible printed board may have hole areas at which the carrier foil is punched or provided with holes such that a hole area and a soldering surface are concentric with one another, and the soldering surface is larger than the hole area. This facilitates a connection of electronic components to a flexible printed board by means of soldering.

A flexible printed board may additionally have at least one test surface provided on the carrier foil. Such a test surface is basically a bonding surface that is not connected to a soldering surface. A check of the properties of a flexible printed board is possible by such arrangement of test surfaces.

A flexible printed board may have a number of soldering surfaces equal to a sum of the number of bonding surfaces plus the number of test surfaces. Thereby the flexible printed board may have a symmetric design with respect to its contact surfaces.

BRIEF DESCRIPTION OF THE DRAWINGS

In the following, exemplary embodiments of the invention will be explained in greater detail on the basis of the drawing in which.

DETAILED DESCRIPTION OF EXAMPLE EMBODIMENTS OF THE INVENTION

Figure 1:
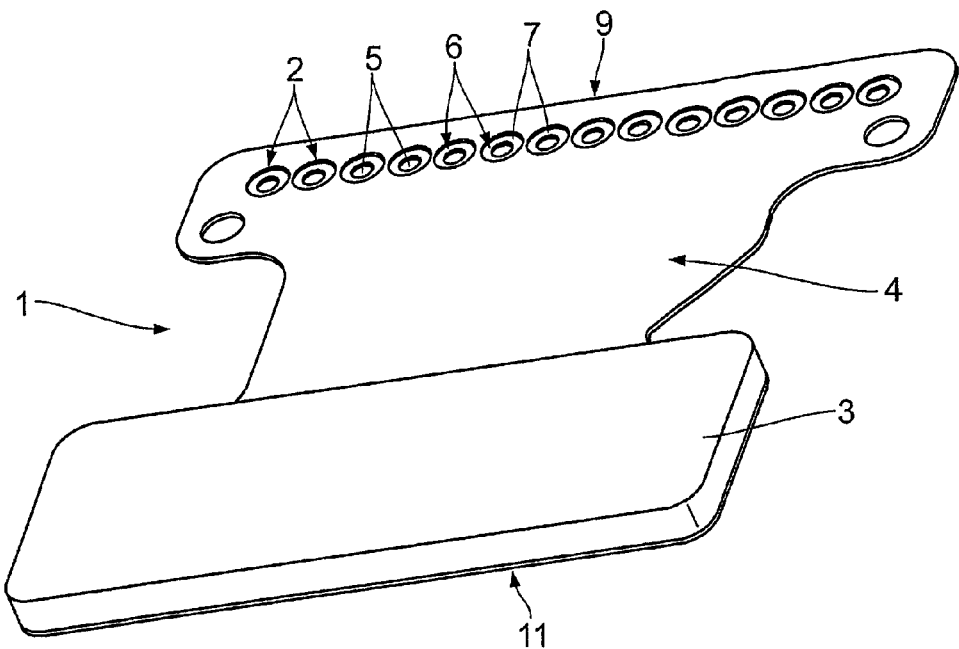
FIGS. 1 and 2 show perspective views of a flexible printed board.

FIG. 1 shows a flexible printed board with a carrier foil 1, with several soldering surfaces 2 and with a stiffening plate 3 that is inseparably connected to the carrier foil 1. The soldering surfaces 2 and the stiffening plate 3 are arranged on a solder side 4 of the carrier foil 1. The carrier foil 1 is punched in sections, wherein a hole area 5 and a soldering surface 2 are arranged concentrically with each other and wherein the soldering surface 2 is larger than the hole area 5. The soldering surface 2 and the hole area 5 that is arranged concentrically with the soldering surface 2 form an annular soldering contact surface 6 that has a contacting layer 7. For establishing an electrically conductive connection, the contacting layer 7 of a soldering contact surface 6 is connected to an electrically conductive layer 8 of the carrier foil 1. The carrier foil 1 is essentially rectangular. The soldering surfaces 2 are arranged along a soldering-surface edge 9 of the carrier foil 1, wherein a distance between the soldering surfaces 2 and the soldering-surface edge 9 is as big as the diameter of the circular soldering surfaces 2 or soldering contact surfaces 6. Rectangular bonding surfaces 10 are arranged along a bonding-surface edge 11 that is arranged opposite the soldering-surface edge 9. The bonding surfaces 10 are arranged centrally with respect to the stiffening plate 3 that is arranged on the opposite surface of the carrier foil 1. As schematically indicated by dashed lines in FIG. 2, and shown in the cross-section of FIG. 3, the bonding surfaces 10 are connected to the soldering surfaces 2 via electrical strip conductors 18, e.g. formed in the electrically conductive layer 8.

Figure 2:
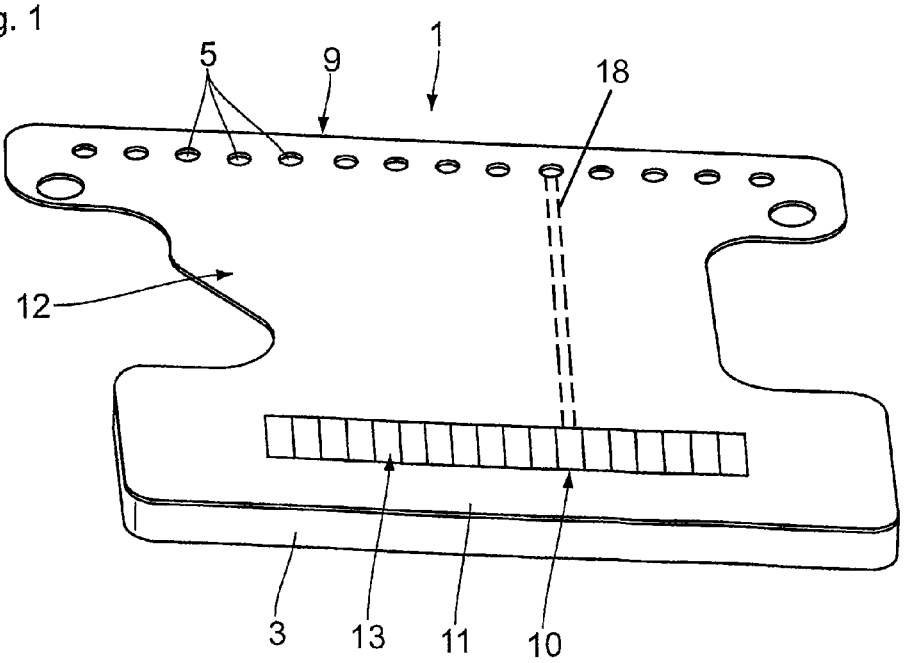

FIG. 2 shows a bonding side 12 of the carrier foil 1, which bonding side 12 is arranged opposite the solder side 4. Bonding surfaces 10 and test surfaces 13 are arranged on the bonding side 12 of the carrier foil 1. The bonding surfaces 10 serve to contact a bonding wire on the flexible printed board, wherein the stiffening plate 3 arranged opposite the bonding surfaces 10 ensures a sufficient stability as a result of mechanical action of a bonding process. The test surfaces 13 serve to check the properties of the flexible printed board, wherein a test surface 13 is similar to a bonding surface 10 except that the test surface 13 is not connected to a soldering surface 2. The bonding surfaces 10 and the test surfaces 13 each have a contacting layer 7. This applies to a contacting layer 7 on a soldering surface 2 as well as to a contacting layer 7 on a bonding surface 10.

Figure 3:
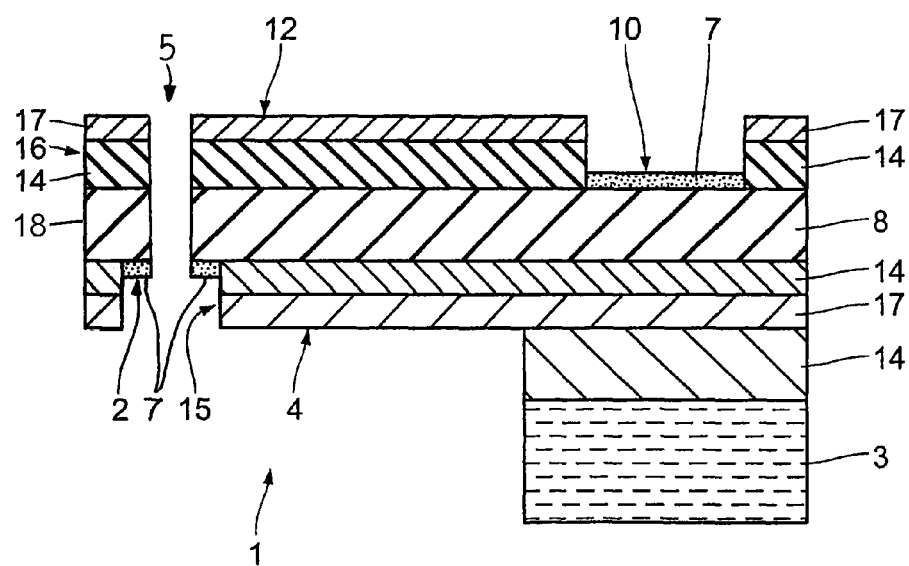
FIG. 3 shows a schematic representation of a layer design of a flexible printed board that is contactable on both sides.

FIG. 3 shows a carrier foil 1 that is inseparably connected to a stiffening plate 3 by means of an adhesive layer 14. The carrier foil 1 has a centrally arranged electrically conductive layer 8 as well as an upper covering layer 15 and a lower covering layer 16. Each of the two covering layers 15, 16 comprises an adhesive layer 14 and a protective layer 17, wherein each of the covering layers 15, 16 is connected to the electrically conductive layer 8 by means of the adhesive layer 14. The upper covering layer 15 is removed, in sections, for producing soldering surfaces 2 on a solder side 4, and a lower covering layer 16 is removed, in sections, for producing bonding surfaces 10 on a bonding side 12, thereby enabling a contacting layer 7 to be arranged directly on the electrically conductive layer 8 so that there is an electrical contact between the contacting layer 7 and the electrically conductive layer 8. The contacting layer 7 is preferably made of a nickel-gold compound, wherein the layer thickness of the contacting layer 7 is less than 20 µm, in particular less than 10 µm and in particular less than 5 µm. The electrically conductive layer 8 is a copper foil and has a layer thickness of 50 to 200 µm, in particular of 70 to 100 µm. Polyimide with a layer thickness of less than 100 µm, in particular of less than 50 µm and in particular of less than 25 µm, is used for the protective layer 17. An acryl-based adhesive agent, e.g. Pyralux®, with layer thicknesses of less than 100 µm, in particular of less than 50 µm and in particular of less than 25 µm, is used as the adhesive layer 14. The stiffening plate 3 is made of aluminium or of one of its alloys. The thickness of the stiffening plate 3 is between 1 and 4 mm, in particular between 2 and 3 mm.

Figure 4:
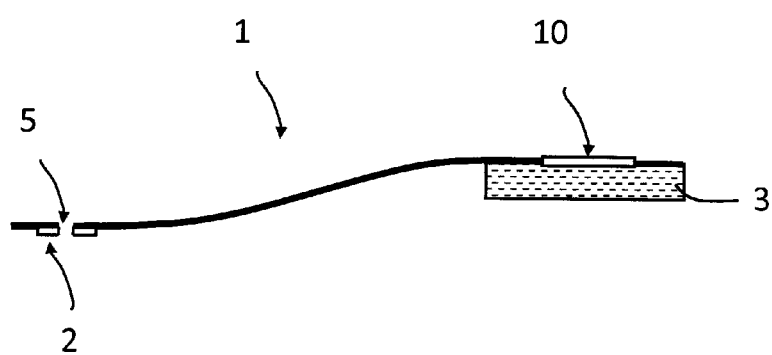
FIG. 4 schematically shows an embodiment in which the carrier film is not planar.

FIG. 4 shows an embodiment in which the carrier foil 1 is not planar, i.e. does not extend along a flat plane.

The invention claimed is:

1. A flexible printed circuit board comprising:
a flexible carrier layer that includes electrically conductive strip conductors running therealong;
plural bonding surfaces that are arranged on a bonding side of said carrier layer, and that are electrically connected to said strip conductors;
plural outwardly exposed soldering surfaces that are arranged on a solder side of said carrier layer opposite said bonding side, and that are electrically connected to said strip conductors whereby said strip conductors electrically connect said soldering surfaces with said bonding surfaces; and
a stiffening plate that is inseparably connected to said carrier layer on said solder side thereof;
wherein said flexible printed circuit board has plural holes penetrating through said soldering surfaces and said carrier layer, said holes are respectively concentrically positioned in said soldering surfaces, each respective one of said soldering surfaces is larger than and extends as a rim around a respective one of said holes and said soldering surfaces are confined to said solder side of said carrier layer and do not penetrate into said holes in said carrier layer.

2. The flexible printed circuit board according to claim 1, wherein said holes are cylindrical holes with cylindrical walls extending perpendicularly through said carrier layer, and wherein said cylindrical walls of said cylindrical holes are formed by exposed surfaces of said carrier layer facing into said holes.

3. The flexible printed circuit board according to claim 1, wherein said bonding surfaces are all located in a first area on said bonding side of said carrier layer, said soldering surfaces are all located in a second area on said solder side of said carrier layer, and said first area is laterally displaced away from said second area along said carrier layer.

4. The flexible printed circuit board according to claim 3, wherein said first area containing said bonding surfaces and said second area containing said soldering surfaces are respectively located along two mutually opposite edges of said carrier layer.

5. The flexible printed circuit board according to claim 4, wherein said carrier layer is shaped essentially as a rectangle.

6. The flexible printed circuit board according to claim 3, wherein said stiffening plate is located on said solder side of said carrier layer in registration with said first area of said bonding surfaces on said bonding side of said carrier layer, and does not extend to said second area of said soldering surfaces.

7. The flexible printed circuit board according to claim 1, wherein said bonding surfaces are all arranged in a first linear row of said bonding surfaces along and proximate to a first edge of said carrier layer, and said soldering surfaces are all arranged in a second linear row of said soldering surfaces along and proximate to a second edge of said carrier layer opposite said first edge.

8. The flexible printed circuit board according to claim 1, wherein all of said bonding surfaces on said bonding side of said carrier layer are centered in registration with an area covered by said stiffening plate on said solder side of said carrier layer.

9. The flexible printed circuit board according to claim 1, wherein said flexible carrier layer comprises an electrically conductive layer in which said strip conductors are formed, and wherein said flexible printed circuit board further comprises a first cover layer on said solder side and a second cover layer on said bonding side of said carrier layer.

10. The flexible printed circuit board according to claim 9, wherein said first cover layer covers said solder side of said carrier layer except for said soldering surfaces, a portion of said first cover layer is interposed between said carrier layer and said stiffening plate, and said second cover layer covers said bonding side of said carrier layer except for said bonding surfaces.

11. The flexible printed circuit board according to claim 9, wherein said first and second cover layers each respectively include a respective protective layer and a respective adhesive layer that adheres said respective protective layer onto said carrier layer.

12. The flexible printed circuit board according to claim 11, wherein each said protective layer is a layer of a synthetic polyimide material.

13. The flexible printed circuit board according to claim 9, wherein said electrically conductive layer comprises a copper foil.

14. The flexible printed circuit board according to claim 9, wherein said first cover layer and said second cover layer have openings therein concentrically aligned with said said soldering surfaces and with said bonding surfaces respectively, said openings in said first cover layer are larger than said holes and uncover said soldering surfaces, at least one said opening in said second cover layer uncovers said bonding surfaces, and said flexible printed circuit board further comprises respective electrical contact layers on said soldering surfaces and on said bonding surfaces in said openings.

15. The flexible printed circuit board according to claim 14, wherein said electrical contact layers consist of a nickel-gold compound.

16. The flexible printed circuit board according to claim 1, wherein said carrier layer is not planar.

17. The flexible printed circuit board according to claim 1, further comprising at least one test surface that is arranged on said bonding side of said carrier layer and that is externally contactable to enable external electrical testing of electrical properties of said flexible printed circuit board, wherein said test surface is arranged adjacent to said bonding surfaces and is electrically connected to said carrier layer but is not electrically connected to any one of said soldering surfaces.

18. The flexible printed circuit board according to claim 17, wherein the number of said soldering surfaces equals the sum of the number of said bonding surfaces and the number of said at least one test surface.

* * * * *

UNITED STATES PATENT AND TRADEMARK OFFICE
CERTIFICATE OF CORRECTION

PATENT NO. : 8,853,547 B2  Page 1 of 1
APPLICATION NO. : 13/124699
DATED : October 7, 2014
INVENTOR(S) : Andreas Voegeri et al.

It is certified that error appears in the above-identified patent and that said Letters Patent is hereby corrected as shown below:

In the Specification

Column 3,
Line 12, after "big as the", insert --outer--;

In the Claims

Column 5,
Line 23, after "with", delete "said" (first occurrence).

Signed and Sealed this
Twenty-fourth Day of March, 2015

Michelle K. Lee
*Director of the United States Patent and Trademark Office*